United States Patent
Borri

(10) Patent No.: US 7,987,331 B2
(45) Date of Patent: Jul. 26, 2011

(54) METHOD AND CIRCUIT FOR PROTECTION OF SENSITIVE DATA IN SCAN MODE

(75) Inventor: Simone Borri, Valbonne (FR)

(73) Assignee: Infineon Technologies AG, Neubiberg (DE)

( * ) Notice: Subject to any disclaimer, the term of this patent is extended or adjusted under 35 U.S.C. 154(b) by 855 days.

(21) Appl. No.: 11/940,806

(22) Filed: Nov. 15, 2007

(65) Prior Publication Data

US 2010/0023719 A1 Jan. 28, 2010

(51) Int. Cl.
  *G06F 12/14* (2006.01)
  *G11C 29/12* (2006.01)
(52) U.S. Cl. .......... 711/166; 365/201; 714/718; 726/27
(58) Field of Classification Search .................. None
  See application file for complete search history.

(56) References Cited

U.S. PATENT DOCUMENTS

| | | | |
|---|---|---|---|
| 5,357,572 A | 10/1994 | Bianco et al. | |
| 6,601,202 B2 | 7/2003 | Palm et al. | |
| 7,185,249 B2 | 2/2007 | Tkacik et al. | |
| 7,363,564 B2 * | 4/2008 | Moss et al. | 714/734 |
| RE41,496 E * | 8/2010 | Simpson et al. | 714/727 |
| 2005/0066189 A1 | 3/2005 | Moss et al. | |

FOREIGN PATENT DOCUMENTS

| | | |
|---|---|---|
| EP | 0 992 809 | 4/2000 |
| EP | 1 443 338 A1 | 8/2004 |
| JP | 2005-182434 A | 7/2005 |

* cited by examiner

*Primary Examiner* — Gary J Portka
(74) *Attorney, Agent, or Firm* — Dickstein Shapiro LLP

(57) ABSTRACT

A reset generator for resetting at least one register in a register bank. The register generator comprises a scan mode input terminal configured to input a scan mode signal, a system reset input terminal configured to input a system reset signal, a secure reset output terminal configured to output a secure reset signal and a combination logic unit configured to combine the scan mode signal and the system reset signal. The combination is such that when the scan mode of the at least one register is activated, the secure reset signal is immediately activated for resetting the at least one register. The activation of the secure reset signal is independent of the system reset signal. The secure reset signal is deactivated when the system reset signal is deactivated and the secure reset signal follows the activation/deactivation cycles of the system reset signal after deactivation.

33 Claims, 5 Drawing Sheets

| | secure_scan 508 | scan_mode 501 | scan_rstn 503 | secure_rstn 505 |
|---|---|---|---|---|
| (1) | '0' | - | - | sys_rstn |
| (2) | '1' | '0' | - | sys_rstn |
| (3) | '1' | '1' | '0' | '0' |
| (4) | '1' | '1' | '1' | sys_rstn |

506

METHOD AND CIRCUIT FOR PROTECTION OF SENSITIVE DATA IN SCAN MODE

BACKGROUND

The present invention generally relates to electronic test devices for testing electronic circuits to be tested, and relates in particular to a method and a circuit for protecting sensitive data during scan mode of the test device. Electronic circuits that have to be tested may contain sensitive information which should not be retrieved during a scan mode of such a testing procedure. Unauthorized use of such a scan test operation of the integrated circuit may result in loss or unauthorized use of sensitive information.

In order to protect this kind of sensitive information, it has been proposed to introduce a test isolation multiplexer into a protected register's chain. FIG. 1 shows a protected register's chain wherein an output signal of the protected register's chain can only be read out if the scan mode is not entered. If the scan mode is entered, i.e. scan mode=1, then the test isolation multiplexer M blocks the output signal O from the protected register's chain.

A major disadvantage of the configuration of the state of the art shown in FIG. 1 is that registers are excluded from the scan mode thus that their functionality cannot be checked. Thus, the registers excluded by the test isolation multiplexer are disadvantageously not tested.

SUMMARY

The present invention to provide an apparatus for electronic testing of electronic circuit units to be tested and a method for testing wherein sensitive data are protected from being read out prior or during a test mode.

According to one aspect of the present invention a reset generator for resetting at least one register in a register bank is provided wherein the reset generator comprises a scan mode input terminal configured to input a scan mode signal for activating scan mode of the at least one register; a system reset input terminal configured to input a system reset signal for resetting the at least one register; a secure reset output terminal configured to output a secure reset signal for resetting the at least one register; and a combination logic unit configured to combine the scan mode signal and the system reset signal wherein the combination logic unit is adapted to switch between operations (i) in a scan mode where the scan mode signal provides a reset of the at least one register, and (ii) in a normal mode where the secure reset signal corresponds to the system reset signal.

According to a second aspect of the present invention a protection device for protecting confidential data is provided wherein the protection device comprises a register bank comprising at least one register to be tested, the at least one register containing confidential data; and a reset generator, having a scan mode input terminal configured to input a scan mode signal for activating scan mode of the at least one register; a system reset input terminal configured to input a system reset signal for resetting the at least one register; a secure reset output terminal configured to output a secure reset signal for resetting the at least one register; and a combination logic unit configured to combine the scan mode signal and the system reset signal wherein the combination logic unit is adapted to switch between operations in a scan mode where the scan mode signal provides a reset of the at least one register, and in a normal mode where the secure reset signal corresponds to the system reset signal, wherein the secure reset output terminal of the reset generator is connected to at least one register reset input terminal of the at least one register.

Furthermore a method for protecting confidential data stored in a register bank which comprises at least one register to be tested is provided wherein the method comprises inputting a scan mode signal for activating scan mode of the at least one register into a scan mode input terminal of a reset generator; inputting a system reset signal for resetting the at least one register into a system reset input terminal of the reset generator; combining the scan mode signal and the system reset signal in order to provide a secure reset signal by means of a combination logic unit which is adapted to switch between operations in a scan mode where the scan mode signal provides a reset of the at least one register, and in a normal mode where the secure reset signal corresponds to the system reset signal; and outputting the secure reset signal for resetting the at least one register via a secure reset output terminal.

Furthermore, a method for testing at least one register is provided, wherein the method comprises inputting a scan mode signal for activating scan mode of the at least one register into a scan mode input terminal of a deactivated reset generator; outputting the content of the at least one register; activating the reset generator; inputting a scan mode signal for activating scan mode of the at least one register into a scan mode input terminal of the activated reset generator; inputting a system reset signal for resetting the at least one register into a system reset input terminal of the activated reset generator; combining the scan mode signal and the system reset signal in order to provide a secure reset signal by means of a combination logic unit which is adapted to switch between operations in a scan mode where the scan mode signal provides a reset of the at least one register, and in a normal mode where the secure reset signal corresponds to the system reset signal; and outputting the secure reset signal for resetting the at least one register via a secure reset output terminal.

DRAWINGS

Embodiments of the present invention are depicted in the drawings and are detailed in the description which follows.

In the drawings:

FIG. 1 shows a block diagram of a conventional protection device for protecting sensitive date contained in registers to be protected;

FIG. 2 exhibits a timing diagram of a reset procedure when the reset generator according to the present invention is switched off;

In the Figures, same reference numerals denote the same or similar parts or steps.

DESCRIPTION

Figure 1:
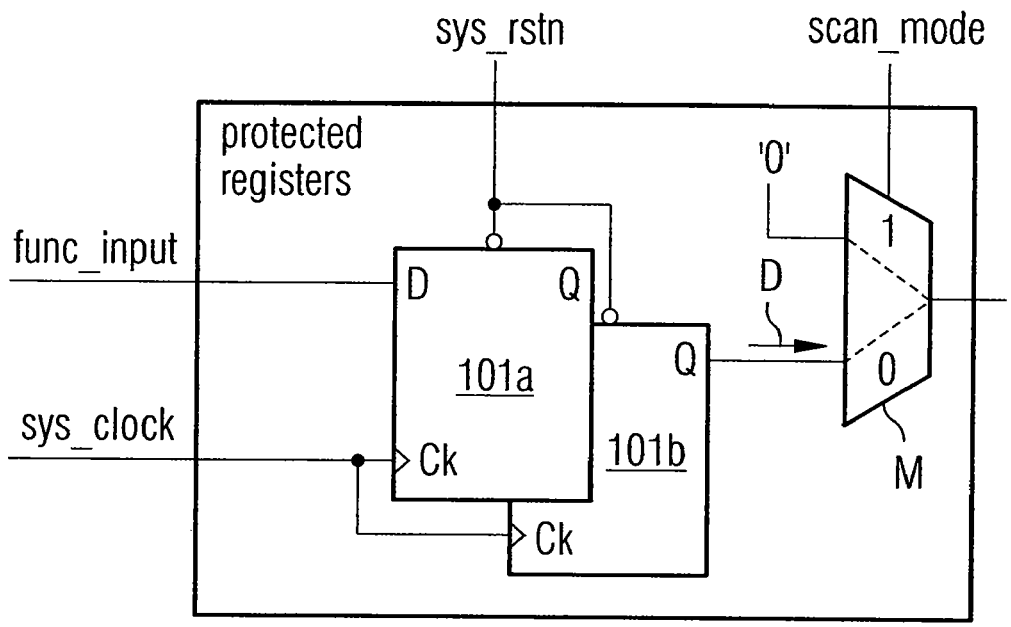

Confidential information or confidential data contained in registers to be protected is erased immediately after the scan mode for these registers is entered. Advantageously, the present invention provides a reset generator which generates an immediate reset signal for the register bank containing the registers to be tested upon the activation of a scan mode signal. After these reset confidential data are erased and the registers to be tested can be investigated using a scan mode procedure and a reset procedure by a system reset signal.

According to a first embodiment of the present invention, a reset generator for resetting at least one register in a register bank is designed such that a scan mode input terminal for inputting a scan mode signal for activating scan mode of the at least one register, a system reset input terminal for inputting a system reset signal for resetting the at least one register, a secure reset output terminal for outputting a secure reset signal of the at least one register and a combination unit for combining the scan mode signal and the system reset signal are provided.

Another advantage of the present invention is that immediately after entering scan mode, registers to be protected are erased such that sensitive information or confidential data are no more accessible. After this first reset, it is preferred that upon the activation of the scan mode a test of the registers contained in the register bank can be performed. The combination logic unit for combining the scan mode signal and the system reset signal provides an active secure reset signal for resetting the at least one register at a point of time when the scan mode of the at least one register is activated. Thus, the combination of the scan mode signal and the system reset signal is such that when the scan mode of the at least one register is activated, the secure reset signal is immediately activated for resetting the at least one register. The activation of the secure reset signal is independent of the system reset signal.

Then the secure reset signal is deactivated when the system reset signal is deactivated and finally the secure reset signal follows the activation/deactivation cycles of the system reset signal. Preferably, after the resetting of the at least one register at once after the scan mode is initiated, the secure reset signal corresponds to the system reset signal.

According to a preferred development of the present invention, a reset control flipflop is provided for generating a scan reset signal in dependence of the system reset signal for deactivating the secure reset signal when the system reset signal is deactivated. Preferably, a control cell is provided for generating a gate control signal in dependence of the scan mode signal and the scan reset signal.

According to another preferred development of the present invention, a reset gating cell is provided for generating the secure reset signal in dependence of the gate control signal and the system reset signal. Preferably, the reset gating cell is an AND gate.

According to another embodiment of the present invention, a reset generator for resetting at least one register in a register bank is provided. The reset generator comprises a scan mode input terminal for inputting a scan mode signal for activating the scan mode of the at least one register, a kernel reset input terminal for inputting a kernel reset signal for resetting the at least one register, a scan release input terminal for inputting a secure scan release signal, a secure reset output terminal for outputting a secure reset signal for resetting the at least one register and a combination logic unit for combining the scan mode signal and the kernel reset signal. This kind of combination is designed such that when the scan mode of the at least one register is activated, the secure reset signal is immediately activated for resetting the at least register. The activation of the secure reset signal is independent of the kernel reset signal.

Furthermore, the secure reset signal is deactivated when the secure scan release signal input in the scan release input terminal is activated. Then, the secure reset signal follows the activation/deactivation cycles of the kernel reset signal.

According to yet another development of the present invention, a reset control flipflop is provided for generating a scan reset signal in dependence of the secure scan release signal for deactivating the secure reset signal.

According to yet another development of the present invention, a control cell is provided for generating a gate control signal in dependence of the scan mode signal and the scan reset signal.

Preferably, a reset gating cell is provided for generating the secure reset signal in dependence of the gate control signal and the kernel reset signal.

According to yet another preferred embodiment of the present invention, a protection device for protecting confidential data is provided, wherein the protection device comprises a register bank comprising at least one register to be tested, the at least one register containing confidential data, and a reset generator wherein the secure reset output terminal of the reset generator is connected to at least one register reset input terminal of the at least one register.

According to yet another preferred development of the present invention, a one-time programmable element is included in the protection device providing a secure scan signal for activating the reset generator as a whole.

According to yet another preferred development of the present invention, the one-time programmable element provided for activating the reset generator is constituted as a laser fuse or an electrical fuse.

Confidential data that are to be protected are at least one of encryption data, electronic keys, secure information and sensitive information.

According to yet another preferred embodiment of the present invention, a method for protecting confidential data stored in a register bank which comprises at least one register to be tested is provided. The method comprises the steps of inputting a scan mode signal for activating scan of the at least one register via a scan mode input terminal of a reset generator, inputting a system reset signal for resetting the at least one register via a system reset input terminal of the reset generator, combining the scan mode signal and the system reset signal in order to provide a secure scan mode signal by means of a combination logic unit.

The combination provided by the combination logic unit is designed such that when the scan mode of the at least one register is activated, the secure reset signal is immediately activated for resetting the at least one register. The activation of the secure reset signal is independent of the system reset signal. The secure reset signal is then deactivated when the system reset signal is deactivated, and finally the secure reset signal follows the activation/deactivation cycles of the system reset signal. Furthermore, the step of outputting the secure reset signal for resetting the at least one register via a secure reset output terminal is provided.

According to yet another preferred development of the present invention, a scan reset signal is generated in dependence of the system reset signal for deactivating the secure reset signal when the system reset signal is deactivated by means of a reset control flipflop.

Preferably, a gate control signal is generated in dependence of the scan mode signal, and the scan reset signal by means of a control cell. It is advantageous that the secure reset signal is generated in dependence of the gate control signal and the system reset signal by means of a reset gating cell.

According to yet another preferred embodiment of the present invention, a method for protecting confidential data stored in a register bank which comprises at least one register to be tested is provided.

The method comprises the steps of inputting a scan mode signal for activating the scan mode of the at least one register via a scan mode input terminal of a reset generator, inputting a kernel reset signal for resetting the at least one register via a kernel reset input terminal of the reset generator, inputting a secure scan release signal via a scan release input terminal of the reset generator, combining the scan mode signal and the kernel reset signal in order to provide a secure reset signal by means of a combination logic such that when the scan mode of the at least one register is activated, the secure reset signal is immediately activated for resetting the at least one register. The activation of the secure reset signal is independent of the kernel reset signal. The secure reset signal is deactivated when the secure scan release signal is activated and the secure reset signal follows the activation/deactivation cycles of the kernel reset signal, and outputting the secure reset signal for resetting the at least one register via a secure reset output terminal.

According to yet another preferred development of the present invention, a scan reset signal is generated in dependence of the secure scan release signal for deactivating the secure reset signal by means of a reset control flipflop.

It is preferred that a gate control signal is generated in dependence of the scan mode signal and the scan reset signal by means of a control cell. Preferably, the secure reset signal is generated in dependence of the gate control signal and the kernel reset signal by means of a reset gating cell.

Figure 3:
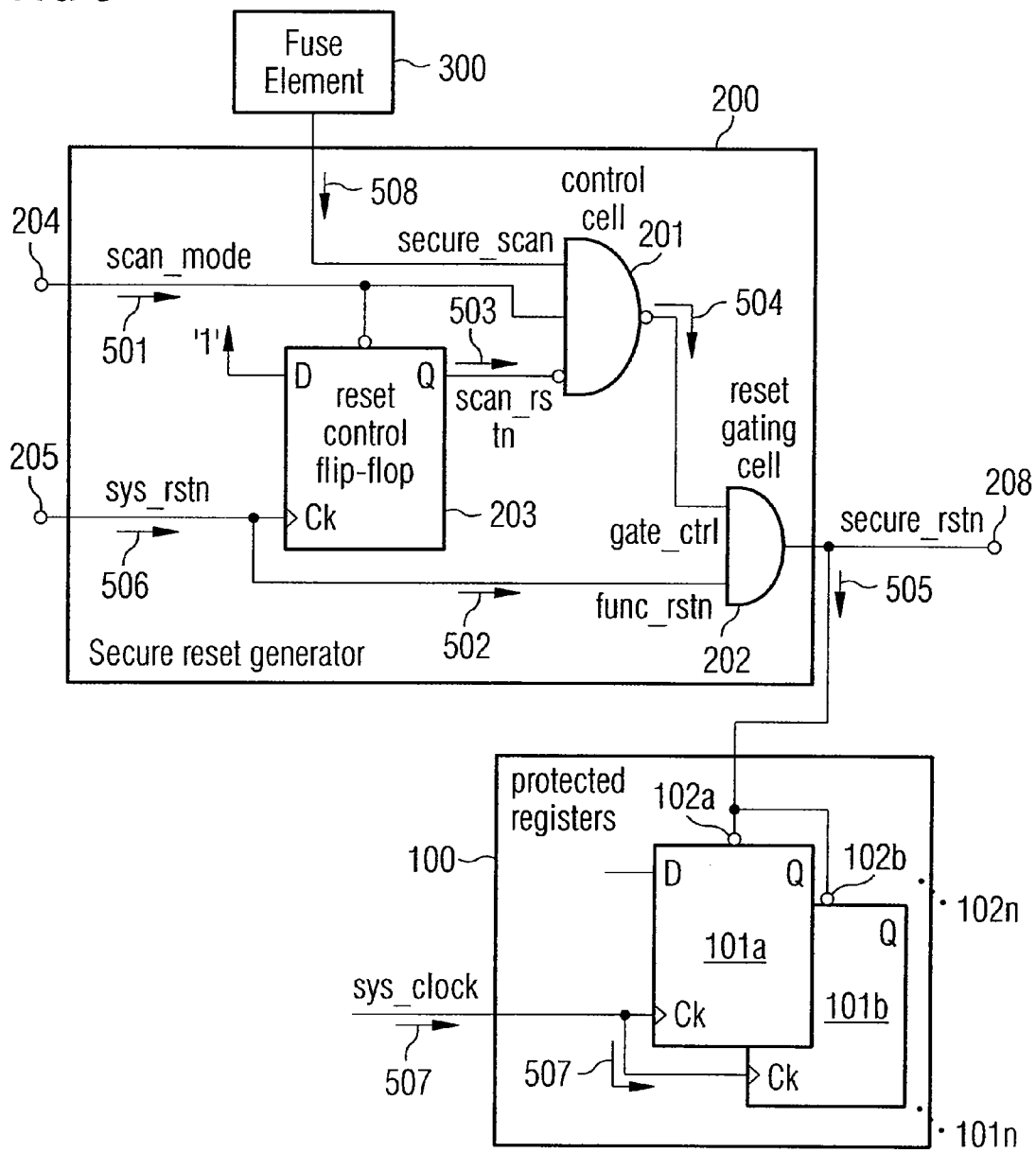
FIG. 3 depicts a block diagram of a first embodiment of a protection device according to the present invention.

FIG. 3 shows a block diagram of a secure reset generator 200 and a register bank 100 according to a first preferred embodiment of the present invention. The reset generator 200 essentially has two input terminals 204 und 205 and one output terminal 208. A first input terminal is a scan mode input terminal 204 receiving a scan mode signal 501.

The scan mode signal 501 is activated (logic "1") when a scan mode of the circuit arrangement is entered. For logic "0" the scan mode signal 501 deactivates the scan mode, i.e. the functional mode of the circuit arrangement is established.

A second input terminal is a system reset input terminal 205 where the system reset signal 506 is applied. The system reset signal 506 provides a system reset, and this signal is processed in the reset generator 200 according to a preferred embodiment of the present invention. The secure reset generator 200 may further comprise an one-time programmable element 300 providing a secure scan signal 508.

According to another preferred development of the present invention, this one-time programmable element 300 is separate from the reset generator 200, and the secure scan signal 508 is applied externally. As depicted in FIG. 3, the secure scan signal 508, the scan mode signal 501 and a scan reset signal 503, which is to be described below, are applied to a control cell 201 which is essentially constituted as a NAND-gate. The exit signal of the control cell 201, i.e. a gate control signal 504, is applied to a following reset gating cell 202 which essentially consists of a NAND-gate. The system reset signal 506 applied to the system reset input terminal 205 is supplied as a function reset signal 502 to one input terminal of the reset gating cell 202. A second input terminal of the reset gating cell 202 is provided with the gate control signal 504.

Herein below, the function of the secure reset generator 200 will be described in more detail. If the gate control signal 504, the generation of which will be described later, has a logic level "1", then the system reset signal 506 applied to the system reset input terminal is fed through the reset generator 200 and appears at the secure reset output terminal as a reset signal for the register bank 100.

The register bank 100 consists of registers 101a-101n, which are to be tested. The registers receive a system clock signal 507 at the clock input CK. It is noted that only two registers to be tested 101a, 101b are shown in FIG. 3, however, the number of registers n is not restricted. If the gate control signal 504 equals logic "1", the system reset signal 506 is identical to a secure reset signal 505 which is applied to register reset input terminals 102a-102n as shown in FIG. 3. This mode is called the "normal scan mode", and its timing diagram is shown in FIG. 2.

Figure 2:
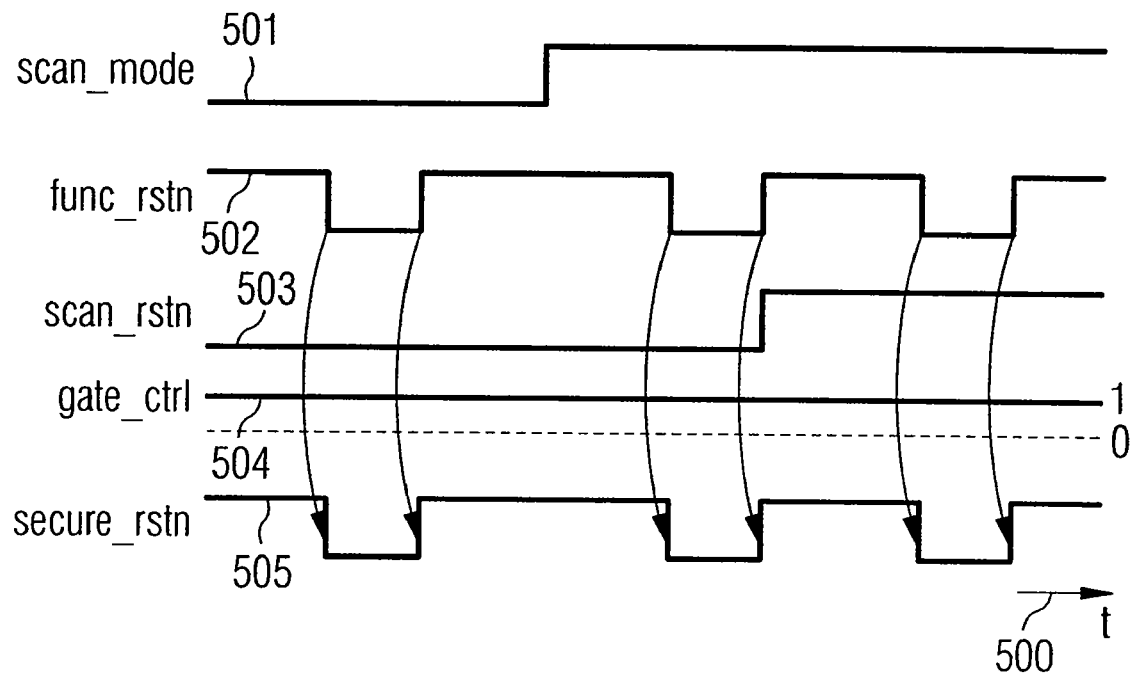

In FIG. 2, respective signals 501, 502, 503, 504 and 505 are shown as a function of time t 500. As explained before, it can be seen in the timing diagram of FIG. 2 that the function reset signal 502 corresponds to the secure reset signal 505. The gate control signal 504 is logic "1" during the whole period of the normal scan mode. The scan reset signal 503 and its timing will be explained herein below. As can be seen from FIG. 2, the scan mode signal 501 has no effect on the output signal of the reset generator 200, i.e. the secure reset signal 505.

The normal scan mode shown in FIG. 2 has the major disadvantage that a system clock 507 may be applied at the registers 101a-101n of the register bank 100 after scan mode is entered and before the functional reset signal 502 reaches the register reset input terminals 102a-102n of the respective registers 101a-101n to be tested. Thus, it is in principle possible to extract sensitive information, e.g. confidential information from the registers 101a-101n to be tested before these registers 101a-101n are reset by a reset signal.

The novel solution according to the first embodiment of the present invention solves this problem by employing the secure reset generator 200. As shown in FIG. 3, the secure reset generator further includes a reset control flipflop 203 which is constituted as a D-flipflop known in the art. The D-input of the reset control flipflop 203 is provided continuously with logic "1" such that a positive edge of the system reset signal 506 which is applied to the clock input (CK) of the reset control flipflop 203 and to a switching of the reset control flipflop 203 such that its Q-output switches to logic "1". It is noted that when scan mode is entered, the scan mode signal 501 is logic "1" such that a reset input of the reset control flipflop 203 is deactivated and, before entering scan mode, the reset control flipflop 203 is reset.

Thus, during scan mode, a positive edge of the system reset signal 506 results in a logic level of "1" of the scan reset signal 503. When the scan reset signal 503 switches from logic "0" to logic "1", the control cell 201 switches its output from logic "0" to logic "1".

The previous output of the control cell 201 of logic "0" results from the fact that all input signals provided for the control cell 201 are logic "1" before. I.e., the secure scan signal 508 is logic "1" because the one-time programmable element 300 is blown, the scan mode signal 501 is logic "1" because the scan mode has been entered and the scan reset signal 503 is logic "1" until a first positive edge of the system reset signal 506 is detected by the reset control flipflop 203.

In other words, when the scan mode is entered (the scan mode signal 501 shifts from logic "0" to logic "1"), the gate control signal 504 is logic "0" such that also the secure reset signal 505 is logic "0" which means that the registers 101a-101n provided in the register bank 100 are reset immediately after entering the scan mode. The logic shown in FIG. 3 is "active low" which means that a logic level of "0" of the secure reset signal 505 results in activating the reset of the registers 101a-101n to be tested. Thus, it is impossible to extract any information once the scan mode has been entered.

In order to release the reset signal, i.e. to provide a logic "1" of the secure reset signal 505, the switching of the reset control flipflop 203 is introduced. After the first positive edge of the system reset signal 506, the Q-output terminal of the reset control flipflop 203 provides a logic "1" for the scan reset signal 503 such that the respective input terminal of the control cell 201 is provided with logic "0". Thus, the control cell 201 switches its output from logic "0" to logic "1" and the situation of the normal scan mode is entered, as explained before.

The difference to the above-described situation is that the normal scan mode now can be applied without any possibility to extract sensitive information from the registers 101a-101n, because the sensitive information has already been deleted from the registers 101a-101n immediately after entering scan mode (immediately after switching the scan mode signal 501 from logic "0" to logic "1").

Figures 4, 5:
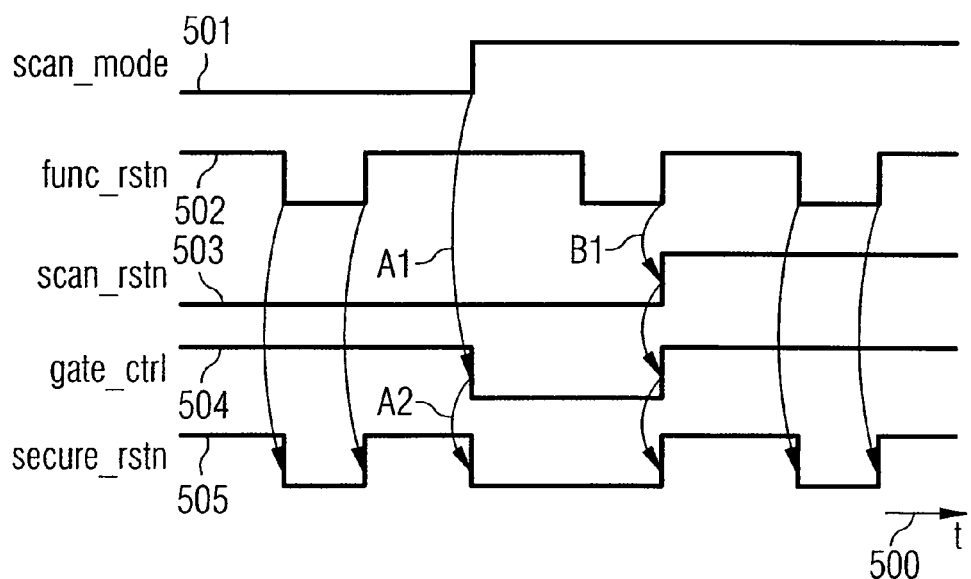
FIG. 4 is a table illucidating the correspondence of a secure scan signal, a scan mode signal, a scan reset signal and a secure reset signal.
FIG. 5 is a timing diagram showing logic signals occurring in the block diagram of FIG. 3.

In order to further elucidate the timing of the respective reset signals during scan mode, FIG. 4 exhibits a table of correspondence for the scan mode signal 501, the secure scan signal 508, the scan reset signal 503 and the secure reset signal 505. As shown in FIG. 4, the secure scan signal 508 determines the operability of the reset generator 200. If the secure scan signal 508 is logic "0", the normal scan mode is switched on, i.e. regardless whether the scan mode is switched on or off, the secure reset signal 505 exactly corresponds to the system reset signal 506.

This is the case if the one-time programmable element 300 is not blown such that the secure scan signal 508 equals logic "0". If the fuse element 300 is blown (the last three lines of the table shown in FIG. 4, i.e. if the secure scan signal 508 equals logic "1"), the secure scan mode is switched on. Line 2 of the table shown in FIG. 4 shows that if the secure scan signal 508 equals logic "1" and the scan mode signal 501 equals logic "0" (i.e. the scan mode is not activated), the secure reset signal 505 still corresponds exactly to the system reset signal 506.

If, however, as shown in line 3 of the table shown in FIG. 4, the scan mode signal equals logic "1" and the scan reset signal equals logic "0", then the secure reset signal 505 equals logic "0". This means that immediately after entering a scan mode (i.e. the scan mode signal 501 equals logic "1"), the registers 101a-101n of the register bank 100 are reset.

In general, an one-time programmable element can only be blown once, i.e. the element has a default value when not blown (usually but not necessarily '0'). It is then possible to blow it once (this will invert the stored value) but it is in general not possible to get back to the previous value. Accordingly, it is still possible to use scan mode to extract the sensitive information before blowing the one-time programmable element, thus permitting to use scan mode to debug the design (e.g. on a test chip), including the protected information. Only once the one-time programmable element is blown, the information will be no more accessible, hence the chip is secure and can now be safely delivered to external customers and end users.

After this kind of reset of the registers to be tested 101a-101n, any confidential information contained in the registers is erased. Thus, as shown in the last line of the table shown in FIG. 4, the scan mode is continued (i.e. the scan mode signal 501 equals logic "1" and the secure scan signal 508 equals logic "1") and leads to a scan reset signal of logic "1" such that the secure reset signal 505 corresponds exactly to the system reset signal 506 as in the case of the normal scan mode line 1 of the table shown in FIG. 4.

Thus, in contrast to the registers shown in FIG. 1, which are excluded from the scan chain, the registers shown in FIG. 3 are included in the scan chain without sacrificing the sensitive information. This will improve the overall test coverage.

FIG. 5 is a timing diagram exhibiting a timing between the signals being present in the reset generator 200, i.e. the scan mode signal 501, the function reset signal 502, the scan reset signal 503, the gate control signal 504 and the secure reset signal 505. As shown in the timing diagram of FIG. 5, once the scan mode is entered (scan mode signal 501 equals logic "1"), the gate control signal 504 exhibits a transition from logic "1" to logic "0" such that the secure reset signal 505 switches from logic "1" to logic "0".

This fact results in a reset of the registers to be tested 101a-101n of the register bank 100. This switching situation is shown by arrows A1 and A2. After a positive edge of the function reset signal 502, the scan reset signal 503 exhibits a transition from logic "0" to logic "1" as shown by the moment in time indicated by arrow B1. At this moment in time, the gate control signal 504 exhibits a transition from logic "0" to logic "1" such that the secure reset signal 505 is fed through the reset gating cell 202 to the secure reset output terminal 208 of the reset generator 200. Thus, starting from the moment indicated by arrow B1, the secure reset signal 505 exactly corresponds to the function reset signal 502.

Figure 6:
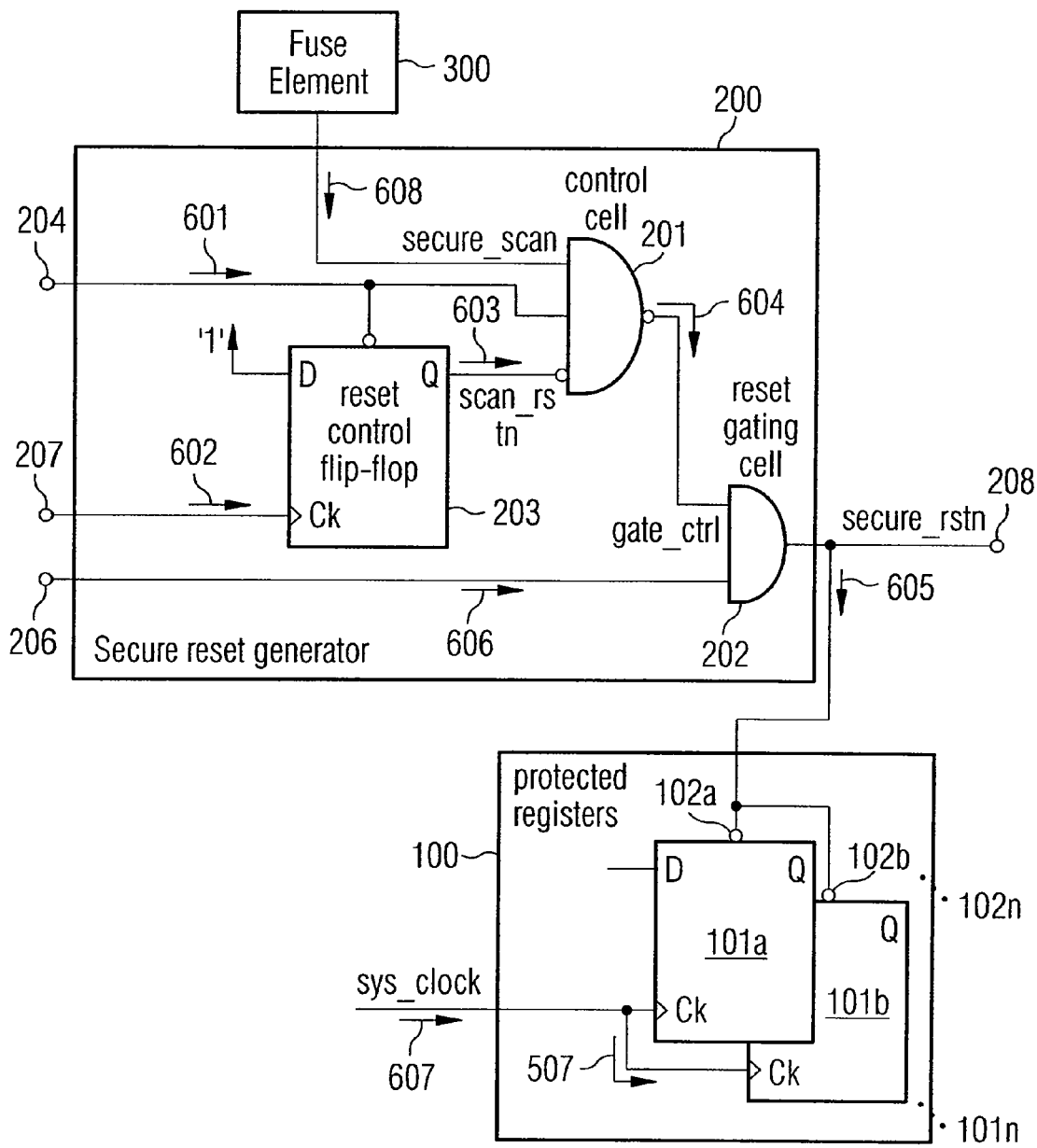
FIG. 6 shows a block diagram of a second preferred embodiment of a protection device according to the present invention.

FIG. 6 illustrates a block diagram of a secure reset generator 200 together with a register bank 100 according to a second preferred embodiment of the present invention. It is noted that parts and operation steps as well as signals which correspond to respective parts, operation steps or signals described with respect to FIG. 3 herein above are not explained again in order to ease the explanation. The main difference of the reset generator 200 shown in FIG. 6 compared to the reset generator 200 shown in FIG. 3 is that a third input terminal is provided at the reset generator 200. The third input terminal is a kernel reset input terminal 206 which receives a kernel reset signal 606. It is thus possible to provide a separate signal as a reset signal, wherein a scan release provided by a secure scan release signal 602 is applied to a scan release input terminal 207.

The advantage of the second embodiment according to the present invention compared with the first embodiment is basically the fact that there is no need to control the functional reset signal in order to release the secure reset. This actually eases the design flow for a test pattern generation, as it is easier to control a separate signal than the functional reset which is normally a time-critical signal which also affects the rest of the whole circuit arrangement. One disadvantage of the second embodiment compared to the first embodiment of the present invention is the fact that a third input signal is required separately.

Figure 7:
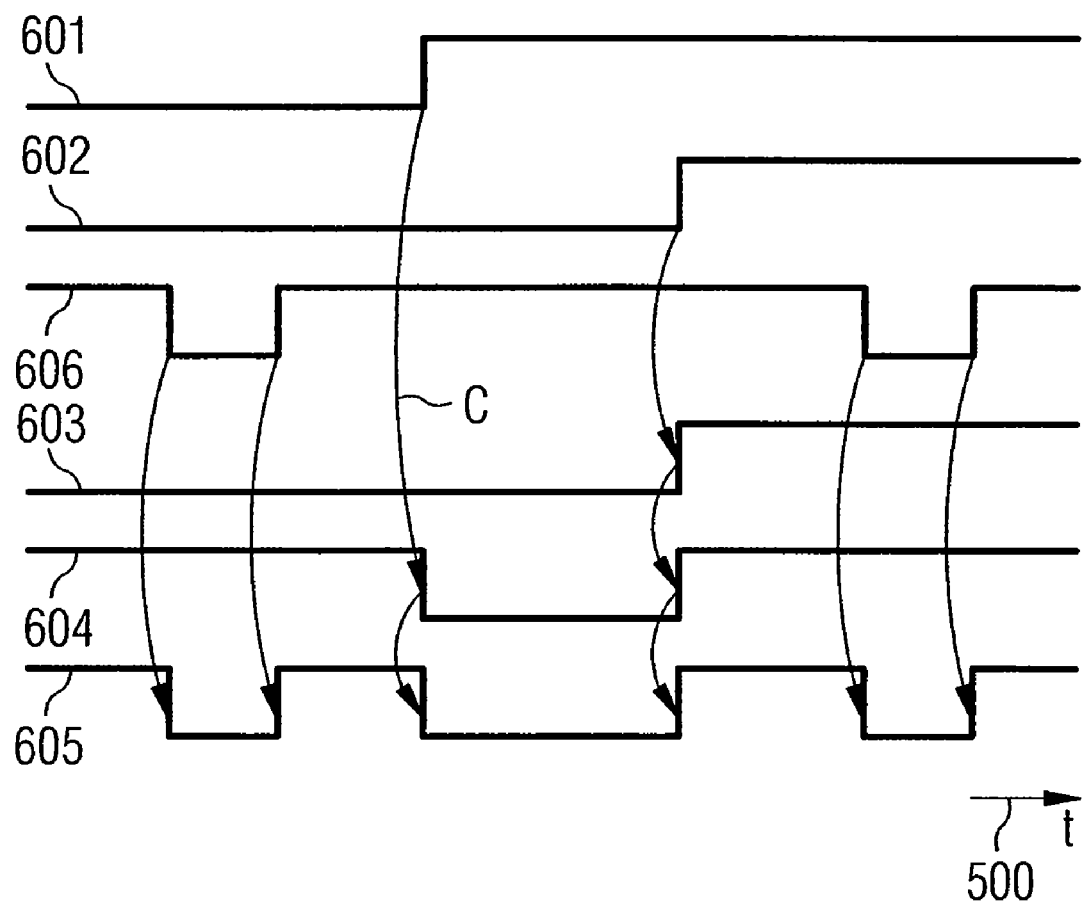
FIG. 7 shows a timing diagram with signals occurring in the block diagram of FIG. 6.

In order to further illustrate the operation of the second embodiment of the present invention shown in FIG. 6, FIG. 7 illustrates a timing diagram of the most important signals provided by the reset generator 200 according to the second embodiment of the present invention. Thus, the time diagram of FIG. 7 illustrates the scan mode signal 601, the secure scan release signal 602, the kernel reset signal 606, the scan reset signal 603, the gate control signal 604 and the secure reset signal 605.

As before, the scan mode signal 601 exhibits a transition from logic "0" to logic "1" as shown by an arrow C in FIG. 7. Immediately after entering the scan mode, the gate control signal 604 is forced to provide a logic transition from logic "1" to logic "0" thus that the secure reset signal 605 also provides a transition from logic "1%" to logic "0". Thus, as the secure reset signal 605 is an "active low" signal, the registers 101a-101n of the registered bank 100 are reset at once. Then, after a transition from a logic "0" to logic "1" of the secure scan release signal 602 provided at the scan release input terminal 207 of the reset generator 200, the secure reset signal 605 follows the kernel reset signal 606 as a function of time 500.

What is claimed is:

1. A reset generator for resetting at least one register in a register bank, the reset generator comprising:
   a) a scan mode input terminal configured to input a scan mode signal for activating scan mode of the at least one register;
   b) a system reset input terminal configured to input a system reset signal for resetting the at least one register;
   c) a secure reset output terminal configured to output a secure reset signal for resetting the at least one register;
   d) a combination logic unit configured to combine the scan mode signal and the system reset signal wherein the combination logic unit is adapted to switch between operations
      (i) in a scan mode where the scan mode signal provides a reset of the at least one register, and
      (ii) in a normal mode where the secure reset signal corresponds to the system reset signal; and,
   a reset control flipflop configured to generate a scan reset signal in dependence on the system reset signal for deactivating the secure reset signal when the system reset signal is deactivated.

2. The reset generator according to claim 1, further comprising:
   a control cell configured to generate a gate control signal in dependence of the scan mode signal and the scan reset signal.

3. The reset generator according to claim 2, further comprising:
   a reset gating cell configured to generate the secure reset signal in dependence of the gate control signal and the system reset signal.

4. The reset generator according to claim 1,
   wherein the reset generator is adapted to activate the secure reset signal immediately when the scan mode of the at least one register is activated such that the at least one register is reset independently of the system reset signal.

5. The reset generator according to claim 1,
   wherein the reset generator is adapted to deactivate the secure reset signal when the system reset signal is deactivated.

6. The reset generator according to claim 1,
   wherein the reset generator is adapted to output the secure reset signal which follows the activation/deactivation cycles of the system reset signal in normal mode.

7. A reset generator for resetting at least one register in a register bank, the reset generator comprising:
   a) a scan mode input terminal configured to input a scan mode signal for activating scan mode of the at least one register;
   b) a system reset input terminal configured to input a system reset signal for resetting the at least one register;
   c) a secure reset output terminal configured to output a secure reset signal for resetting the at least one register;
   d) a combination logic unit configured to combine the scan mode signal and the system reset signal wherein the combination logic unit is adapted to switch between operations
      (i) in a scan mode where the scan mode signal provides a reset of the at least one register, and
      (ii) in a normal mode where the secure reset signal corresponds to the system reset signal;
   e) a kernel reset input terminal configured to input a kernel reset signal for resetting the at least one register; and
   f) a scan release input terminal configured to input a secure scan release signal, wherein the combination logic unit is adapted to operate in a normal mode where the secure reset signal corresponds to the kernel reset signal.

8. The reset generator according to claim 7,
   wherein the reset generator is adapted to activate the secure reset signal immediately when the scan mode of the at least one register is activated such that the at least one register is reset independently of the kernel reset signal.

9. The reset generator according to claim 7,
   wherein the reset generator is adapted to deactivate the secure reset signal when the secure scan release signal is activated.

10. The reset generator according to claim 7,
    wherein the reset generator is adapted to output the secure reset signal which follows the activation/deactivation cycles of the kernel reset signal in normal mode.

11. The reset generator according to claim 7, further comprising:
    a reset control flipflop configured to generate a scan reset signal in dependence on the secure scan release signal for deactivating the secure reset signal.

12. The reset generator according to claim 11,
    wherein a control cell is provided for generating a gate control signal in dependence of the scan mode signal and the scan reset signal.

13. The reset generator according to claim 12, further comprising:
    a reset gating cell configured to generate the secure reset signal in dependence on the gate control signal and the kernel reset signal.

14. A protection device for protecting confidential data, comprising:
    a) a register bank comprising at least one register to be tested, the at least one register containing confidential data;
    b) a reset generator, having
       b1) a scan mode input terminal configured to input a scan mode signal for activating scan mode of the at least one register;
       b2) a system reset input terminal configured to input a system reset signal for resetting the at least one register;
       b3) a secure reset output terminal configured to output a secure reset signal for resetting the at least one register; and
       b4) a combination logic unit configured to combine the scan mode signal and the system reset signal wherein the combination logic unit is adapted to switch between operations
          (i) in a scan mode where the scan mode signal provides a reset of the at least one register, and
          (ii) in a normal mode where the secure reset signal corresponds to the system reset signal; and
    c) a reset control flipflop configured to generate a scan reset signal in dependence on the system reset signal for deactivating the secure reset signal when the system reset signal is deactivated,
    wherein
    d) the secure reset output terminal of the reset generator is connected to at least one register reset input terminal of the at least one register.

15. The device according to claim 14, further comprising:
    a one-time programmable element configured to provide a secure scan signal for activating the reset generator.

16. The device according to claim 15,
    wherein the one-time programmable element configured to activate the reset generator is constituted as a laser fuse.

17. The device according to claim 15,
    wherein the one-time programmable element configured to activate the reset generator is constituted as an electrical fuse.

18. The device according to claim 14,
wherein the confidential data are at least one of encryption data, electronic keys, secure information and sensitive information.

19. A method for protecting confidential data stored in a register bank which comprises at least one register to be tested, the method comprising:
- a) inputting a scan mode signal for activating scan mode of the at least one register into a scan mode input terminal of a reset generator;
- b) inputting a system reset signal for resetting the at least one register into a system reset input terminal of the reset generator;
- c) combining the scan mode signal and the system reset signal in order to provide a secure reset signal by means of a combination logic unit which is adapted to switch between operations
  - (c1) in a scan mode where the scan mode signal provides a reset of the at least one register, and
  - (c2) in a normal mode where the secure reset signal corresponds to the system reset signal;

and
- d) outputting the secure reset signal for resetting the at least one register via a secure reset output terminal,
- e) wherein a scan reset signal is generated in dependence on the system reset signal for deactivating the secure reset signal when the system reset signal is deactivated, by means of a reset control flip-flop.

20. The method according to claim 19,
wherein the reset generator is adapted to activate the secure reset signal immediately when the scan mode of the at least one register is activated such that the at least one register is reset independently of the system reset signal.

21. The method according to claim 19,
wherein the reset generator is adapted to deactivate the secure reset signal when the system reset signal is deactivated.

22. The method according to claim 19,
wherein the reset generator is adapted to output the secure reset signal which follows the activation/deactivation cycles of the system reset signal in normal mode.

23. The method according to claim 19,
wherein a gate control signal is generated in dependence on the scan mode signal and the scan reset signal by means of a control cell.

24. The method according to claim 23,
wherein the secure reset signal is generated in dependence on the gate control signal and the system reset signal by means of a reset gating cell.

25. A method for protecting confidential data stored in a register bank which comprises at least one register to be tested, the method comprising:
- a) inputting a scan mode signal for activating scan mode of the at least one register into a scan mode input terminal of a reset generator;
- b) in putting a system reset signal for resetting the at least one register into a system reset input terminal of the reset generator;
- c) combining the scan mode signal and the system reset signal in order to provide a secure reset signal by means of a combination logic unit which is adapted to switch between operations
  - (c1) in a scan mode where the scan mode signal provides a reset of the at least one register, and
  - (c2) in a normal mode where the secure reset signal corresponds to the system reset signal;
- d) outputting the secure reset signal for resetting the at least one register via a secure reset output terminal;
- e) inputting a kernel reset signal adapted to reset the at least one register via a kernel reset input terminal of the reset generator; and
- f) inputting a secure scan release signal via a scan release input terminal of the reset generator, wherein the combination logic unit is adapted to operate in a normal mode where the secure reset signal corresponds to the kernel reset signal.

26. The method according to claim 25,
wherein the reset generator is adapted to activate the secure reset signal immediately when the scan mode of the at least one register is activated such that the at least one register is reset independently of the system reset signal.

27. The method according to claim 25,
wherein the reset generator is adapted to deactivate the secure reset signal when the secure scan release signal is activated.

28. The method according to claim 25,
wherein the reset generator is adapted to output the secure reset signal which follows the activation/deactivation cycles of the kernel reset signal in normal mode.

29. The method according to claim 23,
wherein a scan reset signal is generated in dependence on the secure scan release signal for deactivating the secure reset signal by means of a reset control flip-flop.

30. The method according to claim 29,
wherein a gate control signal is generated in dependence on the scan mode signal and the scan reset signal by means of a control cell.

31. The method according to claim 30,
wherein the secure reset signal is generated in dependence on the gate control signal and the kernel reset signal by means of a reset gating cell.

32. A method for testing at least one register, the method comprising:
- a) inputting a scan mode signal for activating scan mode of the at least one register via a scan mode input terminal of a deactivated reset generator;
- b) outputting the content of the at least one register;
- c) activating the reset generator;
- d) inputting a scan mode signal for activating scan mode of the at least one register into a scan mode input terminal of the activated reset generator;
- e) inputting a system reset signal for resetting the at least one register via a system reset input terminal of the activated reset generator;
- f) combining the scan mode signal and the system reset signal in order to provide a secure reset signal by means of a combination logic unit which is adapted to switch between operations
  - (f1) in a scan mode where the scan mode signal provides a reset of the at least one register, and
  - (f2) in a normal mode where the secure reset signal corresponds to the system reset signal;

and
- g) outputting the secure reset signal for resetting the at least one register via a secure reset output terminal,
- h) wherein a scan reset signal is generated in dependence on the system reset signal for deactivating the secure reset signal when the system reset signal is deactivated, by means of a reset control flip-flop.

33. The method according to claim 32,
wherein the reset generator is activated by blowing a one-time programmable element.

* * * * *